(12) United States Patent
Carlson et al.

(10) Patent No.: US 8,992,104 B2
(45) Date of Patent: Mar. 31, 2015

(54) APPARATUS AND METHOD FOR MAKING FIDUCIALS ON A SUBSTRATE

(75) Inventors: Daniel H. Carlson, Arden Hills, MN (US); Daniel J. Theis, Mahtomedi, MN (US); Brian K. Nelson, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 635 days.

(21) Appl. No.: 13/130,610

(22) PCT Filed: Dec. 9, 2009

(86) PCT No.: PCT/US2009/067273
§ 371 (c)(1),
(2), (4) Date: May 23, 2011

(87) PCT Pub. No.: WO2010/077719
PCT Pub. Date: Jul. 8, 2010

(65) Prior Publication Data
US 2011/0247511 A1  Oct. 13, 2011

Related U.S. Application Data

(60) Provisional application No. 61/141,308, filed on Dec. 30, 2008.

(51) Int. Cl.
*B41J 11/46* (2006.01)
*H05K 1/02* (2006.01)
(Continued)

(52) U.S. Cl.
CPC .............. *H05K 1/0269* (2013.01); *B41J 3/543* (2013.01); *B41J 11/46* (2013.01); *H05K 3/0082* (2013.01);
(Continued)

(58) Field of Classification Search
CPC ........... B41J 11/46; B41J 2/04501; B41J 2/07
USPC ............ 347/37, 39, 19, 40; 400/76, 582, 583, 400/611

IPC ........................................................ B41J 11/46
See application file for complete search history.

(56) References Cited

U.S. PATENT DOCUMENTS 1,898,723 A  2/1933 Fuller
3,570,735 A  3/1971 Kurz
(Continued)

FOREIGN PATENT DOCUMENTS

CN  2447719 Y  9/2001
CN  1743173     3/2006
(Continued)

OTHER PUBLICATIONS

U.S. Appl. No. 61/141,128, filed Dec. 29, 2008, entitled "Phase-locked Web Position Signal Using Web Fiducials".

*Primary Examiner* — Leslie J Evanisko
(74) *Attorney, Agent, or Firm* — Yufeng Dong; Scott A. Baum; Steven E. Skolnick

(57) ABSTRACT

Fiducials having substantially continuous portions made on a substrate allow the position of the substrate to be determined. An approach for making fiducials involves moving first and second fiducial devices together back and forth across the substrate along a trajectory having a component along the lateral axis of the substrate while the substrate and the first and second fiducial devices are in relative motion along the longitudinal axis of the substrate. The first fiducial device operates to make one fiducial on the substrate during the movement along the trajectory and the relative motion. The second fiducial device operates to make another fiducial on the substrate during the movement along the trajectory and the relative motion. The fiducials may be formed so that they have a constant spatial frequency with the first fiducial being out of phase with respect to the second fiducial.

28 Claims, 9 Drawing Sheets

(51) Int. Cl.
*B41J 3/54* (2006.01)
*H05K 3/00* (2006.01)

(52) U.S. Cl.
CPC *H05K 2201/09918* (2013.01); *H05K 2203/013* (2013.01); *H05K 2203/107* (2013.01); *H05K 2203/1545* (2013.01)
USPC .................. 400/76; 347/37; 347/39; 400/611

(56) References Cited

U.S. PATENT DOCUMENTS

| | | | |
|---|---|---|---|
| 3,615,048 A | 10/1971 | Martin | |
| 3,667,031 A | 5/1972 | Cox | |
| 4,010,463 A | 3/1977 | Kay | |
| 4,049,213 A | 9/1977 | Hank | |
| 4,274,748 A | 6/1981 | Burtin | |
| 4,284,221 A | 8/1981 | Nagel | |
| 4,401,893 A | 8/1983 | Dehuysser | |
| 4,529,922 A | 7/1985 | Ono | |
| 4,532,430 A | 7/1985 | Ross | |
| 4,610,739 A | 9/1986 | Jensen | |
| 4,618,518 A | 10/1986 | Pricone | |
| 4,697,485 A | 10/1987 | Raney | |
| 4,893,135 A | 1/1990 | Jamzadeh | |
| 4,945,252 A | 7/1990 | Lerner | |
| 5,047,651 A | 9/1991 | Wessner | |
| 5,355,154 A | 10/1994 | Guerin | |
| 5,450,116 A | 9/1995 | Weiselfish | |
| 5,667,123 A | 9/1997 | Fukuda | |
| 5,768,776 A | 6/1998 | Pendse | |
| 5,778,724 A | 7/1998 | Clapp | |
| 5,859,707 A | 1/1999 | Nakagawa | |
| 5,870,204 A | 2/1999 | Chiu | |
| 5,931,097 A | 8/1999 | Neifert | |
| 6,056,180 A | 5/2000 | Crowley | |
| 6,076,983 A * | 6/2000 | Stein et al. | 400/611 |
| 6,087,655 A | 7/2000 | Kobrin | |
| 6,164,201 A | 12/2000 | Burke | |
| 6,273,313 B1 | 8/2001 | Noll | |
| 6,375,870 B1 | 4/2002 | Visovsky | |
| 6,396,073 B1 | 5/2002 | Taylor | |
| 6,439,786 B1 * | 8/2002 | Hasiuk | 400/611 |
| 6,495,214 B1 | 12/2002 | Nentwich | |
| 6,505,906 B1 | 1/2003 | Bland | |
| 6,521,905 B1 | 2/2003 | Luxem | |
| 6,647,128 B1 | 11/2003 | Rhoads | |
| 7,121,496 B2 | 10/2006 | Jackson | |
| 7,174,237 B2 | 2/2007 | Takayama | |
| 7,296,717 B2 | 11/2007 | Swanson | |
| 7,526,230 B2 | 4/2009 | Kudo | |
| 7,560,718 B2 | 7/2009 | Wittmann | |
| 7,826,041 B2 | 11/2010 | Takeda | |
| 2002/0018220 A1 | 2/2002 | Aoki | |
| 2002/0121131 A1 | 9/2002 | Mancevski | |
| 2002/0122186 A1 | 9/2002 | Igaki | |
| 2003/0000738 A1 | 1/2003 | Rumsey | |
| 2003/0039901 A1 | 2/2003 | Johnson | |
| 2003/0218125 A1 | 11/2003 | Igaki | |
| 2004/0022557 A1 | 2/2004 | Kudo | |
| 2004/0197443 A1 | 10/2004 | Scarabelli | |
| 2004/0227644 A1 | 11/2004 | Lin | |
| 2004/0240513 A1 | 12/2004 | del Puerto | |
| 2004/0262505 A1 | 12/2004 | Atsuta | |
| 2005/0109811 A1 | 5/2005 | Swanson | |
| 2005/0218237 A1 | 10/2005 | Lapstun | |
| 2005/0232475 A1 | 10/2005 | Floeder | |
| 2005/0263689 A1 | 12/2005 | Atsuta | |
| 2005/0274880 A1 | 12/2005 | Atsuta | |
| 2006/0174992 A1 | 8/2006 | Brost | |
| 2006/0210714 A1 | 9/2006 | Huizinga | |
| 2006/0292291 A1 * | 12/2006 | White et al. | 427/58 |
| 2007/0099396 A1 | 5/2007 | Hirai | |
| 2007/0138153 A1 | 6/2007 | Redman | |
| 2008/0039718 A1 | 2/2008 | Drinan | |
| 2008/0073493 A1 | 3/2008 | Atsuta | |
| 2010/0097462 A1 | 4/2010 | Carlson | |
| 2010/0187277 A1 | 7/2010 | Carlson | |
| 2010/0188668 A1 | 7/2010 | Carlson | |
| 2010/0196607 A1 | 8/2010 | Carlson | |
| 2010/0279081 A1 * | 11/2010 | Koele et al. | 428/195.1 |

FOREIGN PATENT DOCUMENTS

| | | |
|---|---|---|
| CN | 1861397 | 11/2006 |
| DE | 197 54 776 | 6/1999 |
| EP | 0 838 665 | 4/1998 |
| EP | 1 235 054 | 8/2002 |
| EP | 1 722 021 | 11/2006 |
| GB | 2 065 871 | 7/1981 |
| GB | 2 195 179 | 3/1988 |
| JP | 62-111860 | 5/1987 |
| JP | S62-132165 | 6/1987 |
| JP | 02-037963 | 8/1990 |
| JP | 05-010725 | 1/1993 |
| JP | 06-029661 | 2/1994 |
| JP | H06-029661 U | 4/1994 |
| JP | 11-167165 A | 6/1999 |
| JP | 2003-200385 | 7/2003 |
| JP | 2005-178962 | 7/2005 |
| JP | 2006-071551 | 3/2006 |
| WO | WO 95/07821 | 3/1995 |
| WO | WO 2005/106104 | 11/2005 |
| WO | WO 2006/107057 | 10/2006 |
| WO | WO 2007/027757 | 3/2007 |
| WO | WO 2008/088650 | 7/2008 |

* cited by examiner

APPARATUS AND METHOD FOR MAKING FIDUCIALS ON A SUBSTRATE

CROSS REFERENCE TO RELATED APPLICATIONS

This application is a national stage filing under 35 U.S.C. 371 of PCT/US2009/067273, filed 9 Dec. 2009, which claims priority to Provisional Application No. 61/141,308, filed 30 Dec. 2008, the disclosure of which is incorporated by reference in its/their entirety herein.

TECHNICAL FIELD

The present invention is related to approaches for making fiducials having substantially continuous portions on a substrate. The fiducials may be used for determining the position of the substrate.

BACKGROUND

Fabrication of many articles, including flexible electronic or optical components, involves registration between layers of material deposited or formed on an elongated substrate or web. The formation of the material layers on the web may occur in a continuous process or a step and repeat process involving multiple steps. For example, patterns of material may be deposited in layers on an elongated substrate, such as a web, through multiple deposition steps to form layered electronic or optical devices. Some articles require precise registration of features that are applied on one or both sides of the substrate.

To achieve accurate registration between the layers, lateral (crossweb) positioning and longitudinal (downweb) positioning must be maintained as the substrate moves through multiple manufacturing steps. Maintaining registration between layers formed on the substrate becomes more complex when the substrate is flexible or stretchable. Some articles are made in multiple steps during which materials or processes are sequentially applied to the substrate, requiring precise position registration for each of the process steps.

Fiducials are orientation features of a substrate that can be used to determine the substrate position as the substrate moves, along with the articles being formed thereon, through various fabrication steps. It is desirable to increase the resolution obtainable from the substrate fiducials to enhance substrate position sensing. There is a need for enhanced methods and systems to make fiducials on a substrate which simplify production, reduce costs and/or increase the resolution of substrate position sensing. The present invention fulfills these and other needs, and offers other advantages over the prior art.

SUMMARY

An embodiment of the invention is directed to an apparatus configured to make fiducials on a substrate. A first fiducial device makes one fiducial on the substrate and a second fiducial device makes another fiducial on the substrate. Each of the fiducials made by the first and second fiducial devices have at least a continuous portion with a slope that is finite and non-zero relative to the longitudinal axis of the substrate.

A movement mechanism provides relative motion between the substrate and the first and second fiducial devices along the longitudinal axis. The first and second fiducial devices are coupled together and an actuator moves the first and second fiducial devices together back and forth along a trajectory having a lateral axis component. During movement of the first and second fiducial devices along the trajectory and during the relative motion along the longitudinal axis, the first fiducial device operates to make one fiducial on the substrate and the second fiducial device operates to make another fiducial on the substrate.

Another embodiment involves an apparatus configured to print fiducials on a substrate. The apparatus includes a first print aperture that ejects ink to print a first fiducial. A second print aperture ejects ink to print a second fiducial. A movement mechanism provides relative motion between the substrate and the first and second print apertures along the longitudinal axis of the substrate. An actuator moves the first and the second print apertures together back and forth along a trajectory having at least a lateral axis component. The first print aperture prints one fiducial on the substrate and the second print aperture prints another fiducial on the substrate during the movement of the first and second print apertures along the trajectory and the relative motion between the first and second print apertures and the substrate along the longitudinal axis.

Yet another embodiment is directed to a method of making fiducials on a substrate having a longitudinal axis and a lateral axis. A first fiducial device and a second fiducial device move together back and forth along a trajectory having a component along the lateral axis while the substrate and the first and second fiducial devices are in relative motion along the longitudinal axis. The first fiducial device operates to make one fiducial on the substrate during the movement along the trajectory and during the relative motion along the longitudinal axis. The second fiducial device operates to make another fiducial on the substrate during the movement along the trajectory and during the relative motion.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
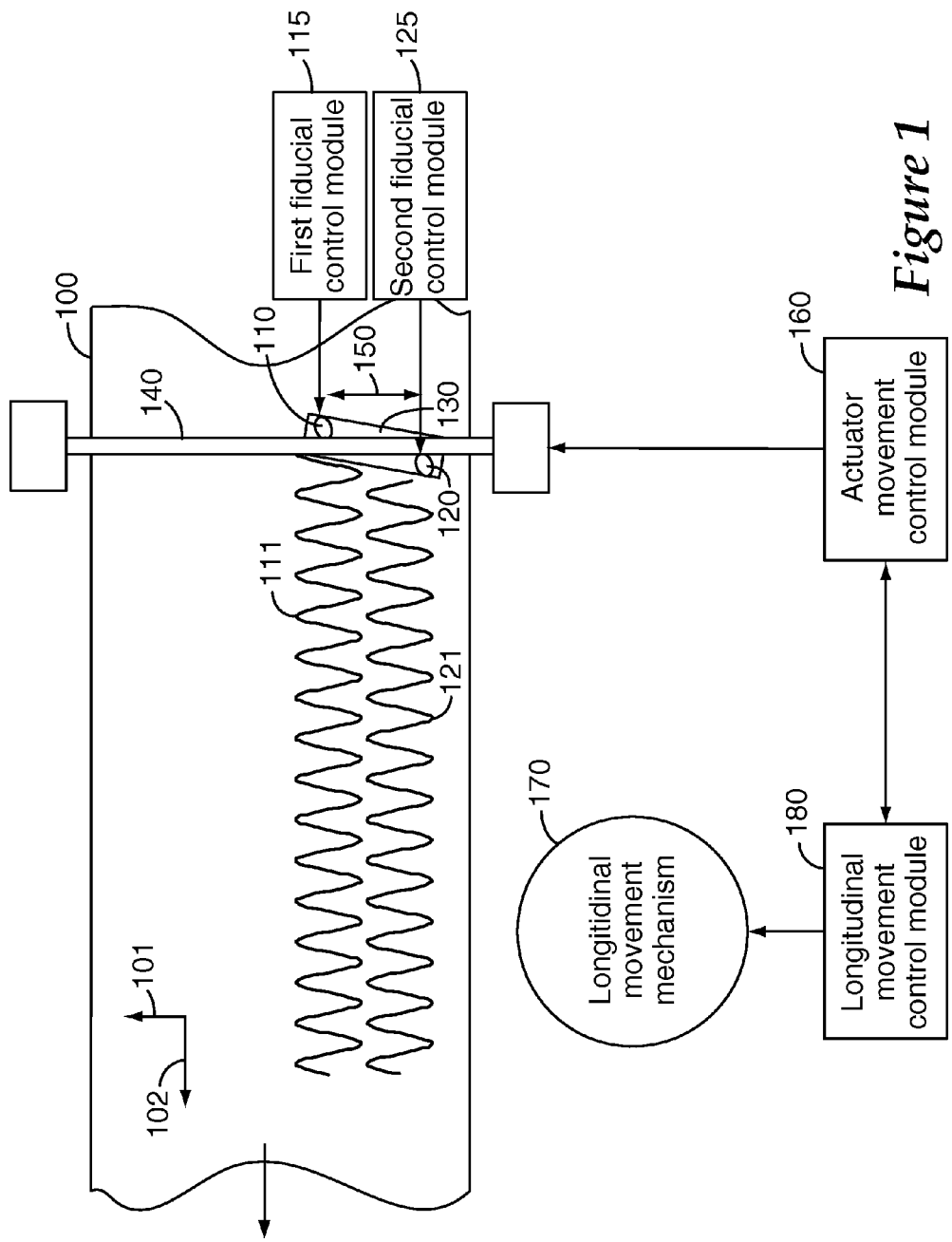
FIG. 1 is a block diagram of an apparatus for making fiducials on a substrate in accordance with embodiments of the invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description of the illustrated embodiments, reference is made to the accompanying drawings which form a part hereof, and in which is shown by way of illustration, various embodiments in which the invention may be practiced. It is to be understood that other embodiments may be utilized and structural changes may be made without departing from the scope of the present invention.

Embodiments of the invention illustrate methods and systems for forming fiducials on a substrate which enhance the resolution of substrate position sensing. For example, the fiducials described herein may be used to facilitate alignment between multiple layers of material deposited on a substrate web during a roll-to-roll manufacturing process.

In some previous approaches, fiducials that comprise a series of discrete fiducial marks, similar to marks on a ruler, are arranged along an axis of the substrate. These discrete marks are then used to determine the substrate position along the axis. However, this type of fiducial can only provide intermittent position detection at the fiducial marks and does not provide position information during the intervals between the discrete fiducial marks. The fiducials made according to the various embodiments discussed herein include fiducial elements that are substantially continuous or piece-wise continuous, i.e., fiducials having substantially continuous portions, which can be used to provide continuous position updates and more accurate substrate positioning.

FIG. 1 is a block diagram of an apparatus for making fiducials on a substrate 100 in accordance with embodiments of the invention. The substrate 100 may be made of any suitable material and may be rigid or flexible. The lateral 101 and longitudinal 102 axes of the substrate 100 are shown in FIG. 1 for reference. The apparatus includes at least a first fiducial device 110 configured to make one fiducial 111 on the substrate 100 and a second fiducial device 120 configured to make another fiducial 121 on the substrate 100. The operation of the first fiducial device 110 is controlled by a first fiducial control module 115. The operation of the second fiducial device 120 is controlled by a second fiducial control module 125. The fiducial devices 110, 120 can include any type of device capable of making a fiducial on the substrate. For example, the fiducial devices can make fiducials 111, 121 by ink jet printing, laser printing, laser scribing, mechanical scribing, direct contact printing, laser ablation, and/or other techniques.

The first and second fiducial devices 110, 120 are coupled together by a coupling member 130 and are positioned relative to a surface of the substrate 100, such as by suspending the first and second fiducial devices 110, 120 over the substrate 100. An actuator 140 moves the fiducial devices 110, 120 back and forth together across the surface of the substrate 100 along a trajectory 150 that has at least a lateral axis 101 component. An actuator control module 160, which may include analog and/or digital circuitry and/or may comprise a processor implementing hardware or software controls the operation of the actuator 140 and thus the movement of the first and second fiducials 110, 120 along the trajectory 150. The frequency of the back and forth movement of the fiducial devices 110, 120 may be constant or non-constant and/or may be performed in discrete steps. One particularly useful implementation is movement of the first and second fiducial devices 110, 120 back and forth along the trajectory 150 at a substantially constant spatial frequency with respect to the longitudinal axis. In this implementation, if the movement of the substrate 100 relative to the first and second fiducial devices 110, 120 along the longitudinal axis 102 is substantially spatially constant, the resulting fiducials 111, 121 are sinusoidal and have a substantially constant spatial frequency relative to the longitudinal axis of the substrate, as illustrated in FIG. 1. Fiducials having constant spatial frequency can be used to generate a constant frequency fiducial sensor signal when the substrate speed is substantially constant.

The fiducial-making apparatus also includes a mechanism 170 configured to provide relative motion between the substrate 100 and the first and second fiducial devices 110, 120 along a longitudinal axis 102 of the substrate. In some implementations, the relative motion is provided by moving the first and second fiducial devices 110, 120, whereas in some implementations, the relative motion is provided by moving the substrate 100. For example, the longitudinal movement mechanism 170 may comprise a moveable table or a rotating drum.

The operation of the longitudinal movement mechanism 170 is controlled by a control module 180, which may be electronic and which may be coupled to the actuator movement control module 160 for coordinating the movements of the actuator 140 and the substrate 100. Feedback can be used to reduce movement errors. One or more of the control modules 160, 180 are functionally connected to the longitudinal movement mechanism 170 and the lateral movement actuator 140, the one or more control modules being configured to coordinate the relative longitudinal motion and the relative lateral motion such that the first fiducial device 110 moves along a first relative trajectory with respect to the substrate and the second fiducial device 120 moves along a second relative trajectory with respect to the substrate 100, the first and second relative trajectories respectively corresponding to the first and second fiducials 111, 121 and being phase shifted with each other.

The fiducial-making apparatus of FIG. 1 is configured to make two fiducials 111, 121 on the substrate 100, although additional fiducial devices may be used to make additional fiducials if desired. Each fiducial is made separately by one fiducial device. In the example shown in FIG. 1, the first fiducial device 110 operates to make one fiducial 111, and the second fiducial device 120 operates makes another fiducial 121. Each of the fiducials 111, 121 generally have regions where the slope of the fiducial 111, 121 is finite and non-zero relative to the longitudinal axis.

Fiducials having sloped regions are advantageous because they provide more position information than a series of discrete fiducial elements, e.g., ruler-type marks, which run longitudinally along the substrate. Discrete fiducial marks typically provide position information only at each of the discrete marks and offer no additional position information between the discrete fiducial marks. Thus, the resolution of a fiducial which is a series of discrete ruler-type marks is controlled by the distance between the marks. In contrast, for fiducials having continuous, sloped regions, the resolution of the fiducial is not constrained by the distance between discrete marks. Where the shape of the fiducial is known, the detected shape can be used to provide continuous position information, thus increasing the resolution of substrate position sensing.

Figure 2:
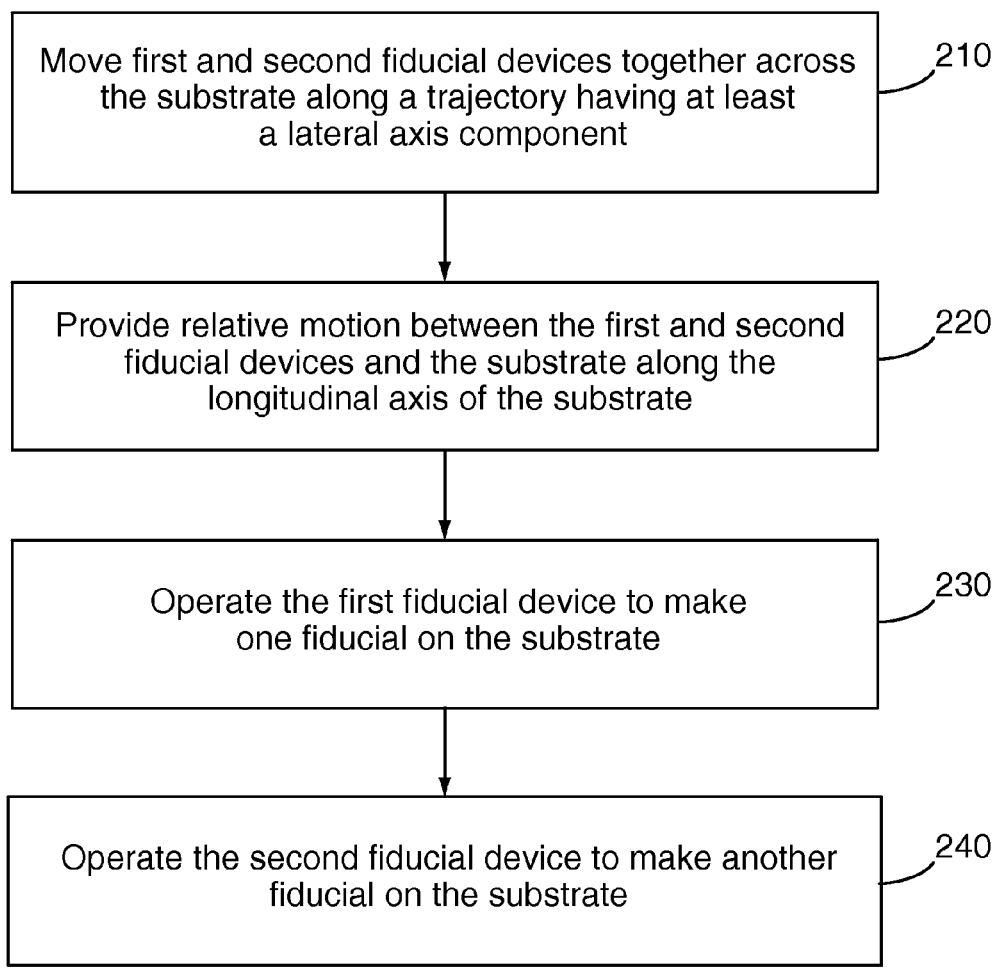
FIG. 2 is a flow diagram illustrating a method of making fiducials in accordance with embodiments of the invention.

The flow diagram of FIG. 2 describes a method of making fiducials in accordance with embodiments of the invention. The first and second fiducial devices are moved 210 together across the substrate along a trajectory having at least a lateral axis component. Relative motion between the first and second fiducials and the substrate is provided 220 along the longitudinal axis of the substrate. The first fiducial device is operated 230 during the movement along the trajectory and the relative motion between the substrate and the first and second fiducial devices to make one fiducial on the substrate. The second fiducial device is operated 240 during the movement along the trajectory and the relative motion between the substrate and the first and second fiducial devices to make another fiducial on the substrate. Each of the first and the second fiducials has regions where the slope of the fiducial is finite and non-zero relative to the longitudinal axis.

Figure 3:
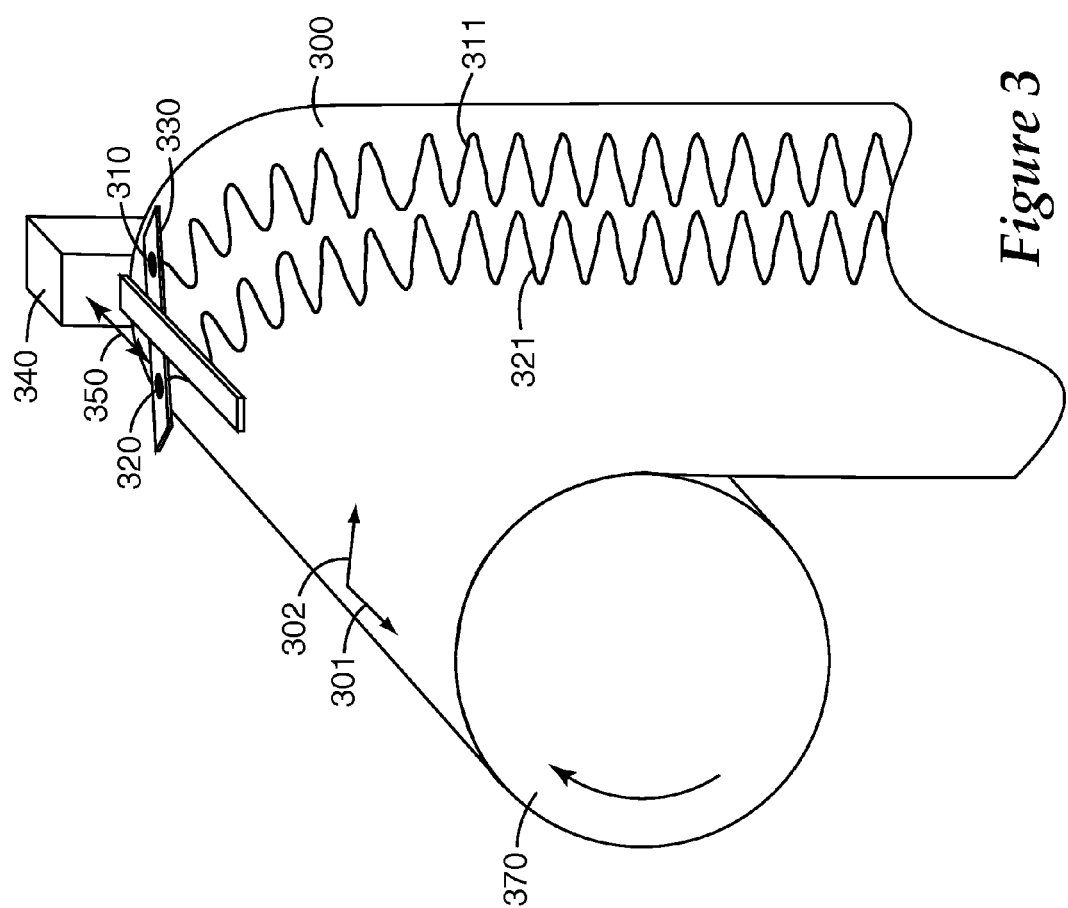
FIG. 3 illustrates an apparatus for making fiducials on a flexible web constrained on a rotating drum.

FIG. 3 illustrates a view of an apparatus for making fiducials on a substrate comprising a flexible web which is constrained on a rotating drum in accordance with embodiments of the invention. In this embodiment, the substrate is a flexible, elongated web 300. The orientations of the lateral 301 and longitudinal 302 axes of the web 300 are indicated for reference. The web 300 is constrained on a drum 370 to facilitate the process of making the fiducials 311, 321 on the web 300, for example, during a roll to roll process. First 310 and second 320 fiducial devices are coupled together by a coupling member 330 and are suspended above the web 300. Rotation of the web 300 by the drum 370 provides relative motion between the fiducial devices 310, 320 and the web 300 along the longitudinal web axis 302. An actuator 340 moves the first and second fiducial devices 310, 320 together along a trajectory 350 that is substantially parallel to the lateral axis 301 of the web 300. The first fiducial device 310 operates to make one fiducial 311 on the web 300 and the second fiducial device 320 operates to make another fiducial 321 on the web 300.

The rotation of the drum 370 is controlled by a drum control mechanism (not shown). Movement of the actuator 340 and/or rotation of the drum 370 may be computer controlled to facilitate flexibility in programming the velocity of the drum rotation and/or the actuator motion. Feedback may be used to help control the motion and/or rotation.

Figure 4:
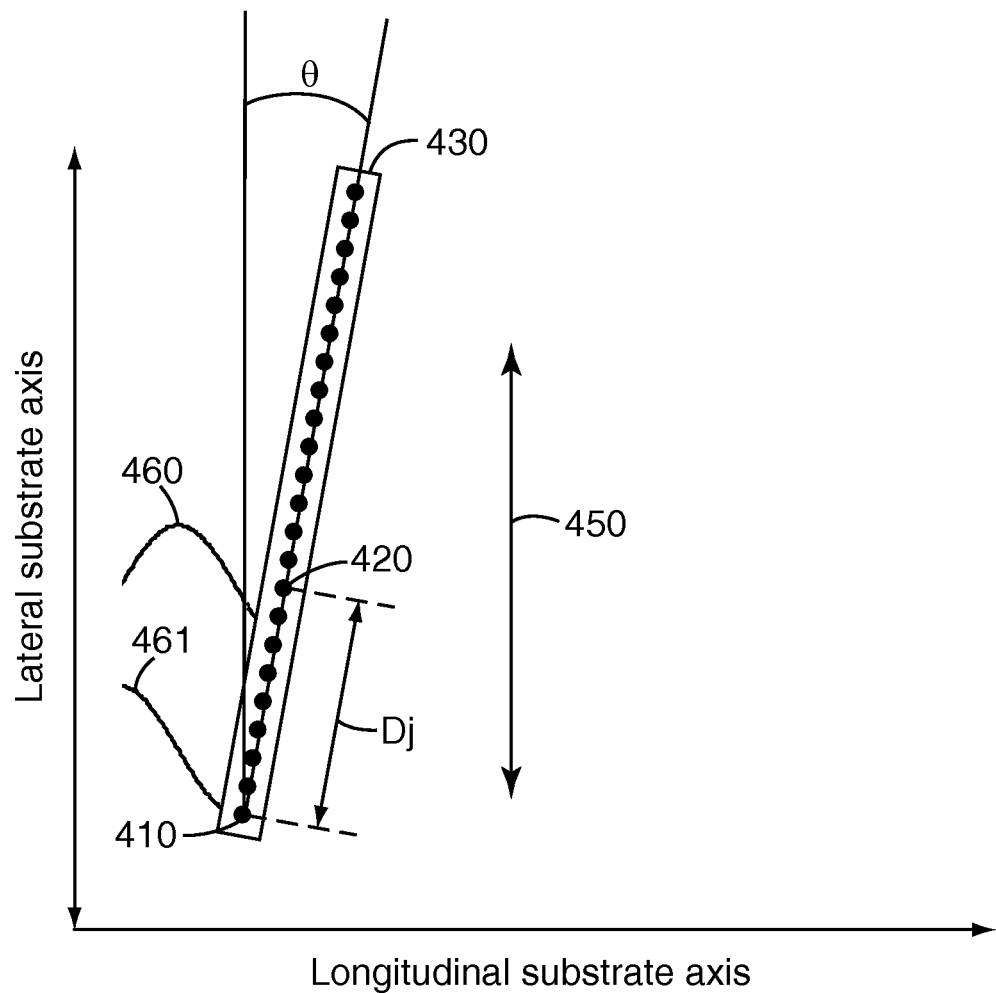
FIG. 4 illustrates a single print head with first and second print apertures oriented at an angle with respect to the lateral axis of the substrate to make fiducials that are phase shifted.

In some embodiments, the fiducial devices comprise ink jet print apertures through which ink is ejected onto the substrate to make the fiducials. As illustrated in FIG. 4, the ink jet apertures 410, 420 used to make the fiducials 460, 461 may be spaced apart on an ink jet print head 430 which serves as a coupling member that couples the ink jet apertures 410, 420 together. A first aperture 410 is used to make one fiducial 461 on the substrate and a second aperture 420 is used to make another fiducial 460 on the substrate. Each of the first and the second apertures 410, 420 may be controlled independently. In one implementation, the ink jet apertures 410, 420 are controlled so that they eject drops at a substantially constant rate. With sufficient resolution, the resulting fiducials 460, 461 are smooth and continuous and show significant improvement over raster scan printed fiducials of comparable scale. One or more additional fiducials can be made using one or more additional ink jet apertures, respectively.

When continuous, periodic fiducials are made, such as sinusoids, the angle, θ, between the ink jet print head 430 and the lateral substrate axis determines the phase shift between the fiducials. For example, if θ is zero and the trajectory of the first and second fiducial devices is substantially parallel to the lateral substrate axis, the two fiducials will be made with the same frequency and phase.

In some implementations, it may be advantageous to produce periodic fiducials that are out of phase. The use of two periodic fiducials that are out of phase, such as sine and cosine fiducials, provides redundant information yielding higher noise immunity, accuracy, and resolution than a single fiducial. FIG. 4 illustrates a configuration that can be used to produce two out of phase periodic fiducials 460, 461. The ink jet print head 430 is tilted so that θ is non zero. Movement of the ink jet apertures 410, 420 along a trajectory 450 that is substantially parallel with the lateral substrate axis while the ink jet apertures 410, 420 eject ink at a substantially constant rate produces periodic fiducials 460, 461 which are out of phase.

In one implementation, the first ink jet print aperture 410 operates to print a sine fiducial and the second ink jet print 420 aperture operates to print a cosine fiducial. The angle, θ, that results in the second ink jet aperture 420 printing a cosine fiducial that is phase shifted by 90 degrees from a sine fiducial printed by the first ink jet aperture 410 can be calculated using the following equation:

$$\theta = \arcsin\left(\frac{P_s}{4 \times D_j}\right) \quad \text{Equation 1}$$

where $P_S$ is the period of the sinusoidal fiducials and $D_j$ is the distance between the first and the second apertures.

When the substrate is flexible, constraining the substrate while the fiducials are made reduces errors caused by substrate distortion. For example, as illustrated in FIG. 3, a flexible web substrate may be constrained on a rotating drum. For a web constrained on a drum, it may be advantageous to orient the fiducial devices, e.g., the print head of FIG. 4, substantially parallel to the axis of the drum. If the print head is not substantially parallel to the roll, then the distance the ink jet drops must travel will vary based on the position of the aperture. This variation in travel distance between the two ink jet apertures will alter the phase difference between the fiducials.

The sine and cosine fiducials may be scaled to achieve maximum resolution. For example, the amplitudes of the fiducials may be made as large as possible to maximize the fiducials within the image view of a substrate positioning sensor, with some margin to allow for lateral position errors. The longitudinal scaling may be selected based on expected speed of operation. Using a sharper pitch of the sine and cosine fiducials (higher frequency and smaller peak to peak distance) provides steeper slopes, and more resolution in the longitudinal direction. An excessively high pitch can reduce signal to noise ratio and also increases the required sampling rate for the sensor used to detect the fiducials for positioning the substrate.

Figure 5:
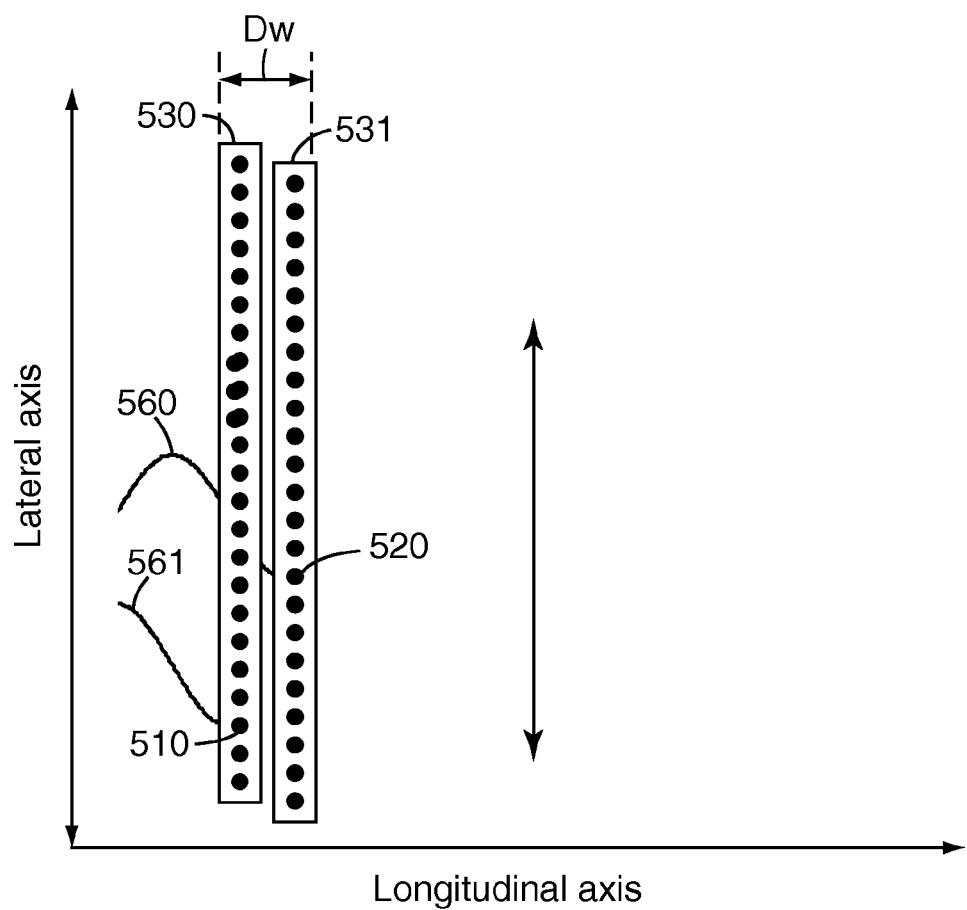
FIG. 5 illustrates two print heads having first and second print apertures, respectively, the first and second print apertures oriented to make fiducials that are phase shifted.

FIG. 5 illustrates another embodiment for ink jet printing fiducials 560 on a substrate. The implementation depicted in FIG. 5 uses two print heads 530, 531. The print heads 530, 531 are coupled together so that the first 510 and second 520 apertures move together across the substrate. Any of the apertures may be selected from the print heads 530, 531. An aperture 510 selected from the first print head 530 prints one fiducial 561 on the substrate and an aperture 520 selected from the second print head 531 prints another fiducial 560. The first and second apertures 510, 520 may be spaced apart so that the fiducials 561, 560 are shifted out of phase with each other. The phase difference between the fiducials 561, 560 is determined by the downweb distance, Dw, between the print apertures 510, 520.

The fiducials described herein may be made by a variety of process, including ink jet printing as described in more detail above. The approaches discussed in connection with FIGS. 1-5 above may be applied to making fiducials by other processes. For example, orientation of the fiducial devices (ink jet apertures) illustrated in FIGS. 4 and 5 to achieve sinusoidal, phase shifted fiducials may be applied to other types of fiducial-making processes such as contact direct printing, laser printing, laser marking, laser scribing, photolithographic processes, ablation, mechanical scribing, and/or other processes capable of making fiducials. The fiducial devices may be controlled so that they operate at a substantially constant energy per unit fiducial area to make smooth, periodic fiducials. All of the fiducials made on the substrate need not be made by the same type of process. One or more first fiducials may be made using a first process, e.g., ink jet printing, and one or more second fiducials may be made using a second process, e.g., laser scribing.

The examples of FIGS. 1-5 illustrate various configurations that use two fiducial devices, however, any number of fiducial devices may be coupled and moved together as described above to make multiple fiducials. In some implementations, it is desirable to use an additional fiducial device that is not coupled to the first and second fiducials devices to form one or more additional fiducials on the substrate. For example, the additional fiducial may comprise a line that is substantially parallel with the longitudinal axis of the substrate or the substrate edge to provide lateral position information for the substrate. U.S. Pat. No. 7,296,717, which is incorporated herein by reference, describes methods and systems that may be used to position the substrate laterally.

Figure 6:
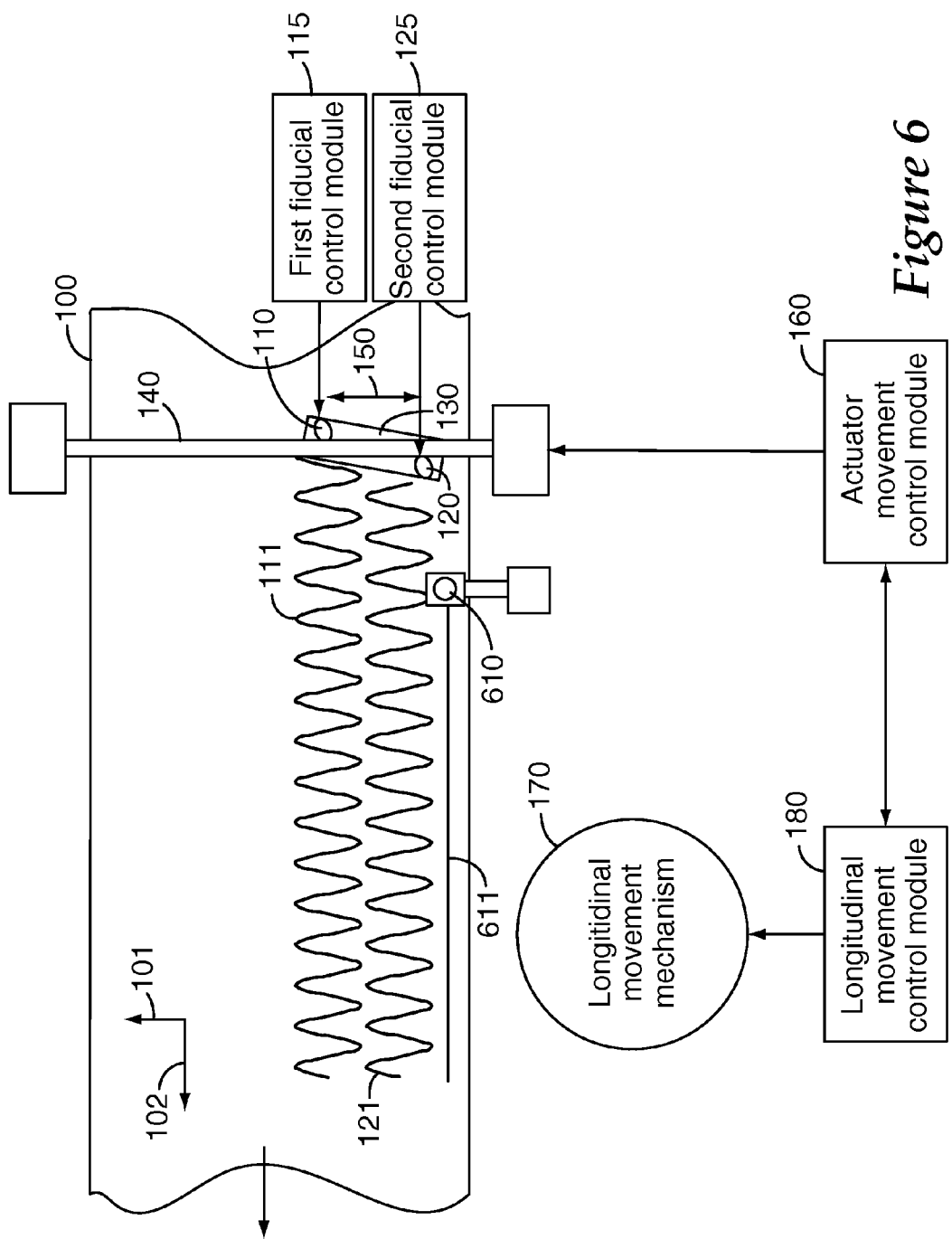
FIG. 6 is a block diagram of an apparatus having two coupled fiducial devices and one additional fiducial device.

FIG. 6 illustrates an apparatus that is configured to make first and second fiducials 111, 121 as illustrated and described in connection with FIG. 1 above. An additional fiducial device 610 is oriented with respect to the substrate 100 to make an additional fiducial 611. The additional fiducial device 610 need not be coupled to the first and second fiducial devices 110, 120. For example, the additional fiducial device 610 may be substantially stationary with respect to the lateral axis 101. The additional fiducial device 610 may comprise any of the fiducial devices mentioned above, e.g., ink jet aperture, photolithographic mask, laser printer, laser scribe, mechanical scribe, direct contact pen. For lateral substrate positioning, the additional fiducial 611 may comprise a line as illustrated in FIG. 6. Alternatively, the additional fiducial 611 may be made in any shape, such as periodic, aperiodic, continuous or discrete. The additional fiducial 611 need not be made during the same pass as the first and second fiducials 111, 121 and may be made in a separate pass, either before or after the first and second fiducials 111, 121 are made.

Figure 7:
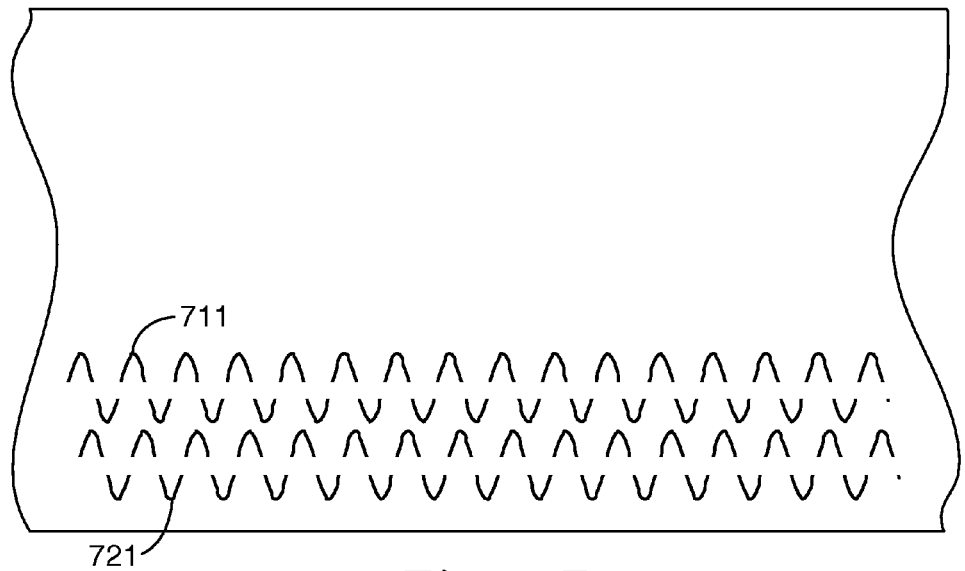
FIGS. 7 and 8 illustrate fiducials that are piecewise continuous which can be formed using approaches in accordance with embodiments of the invention.
Figure 8:
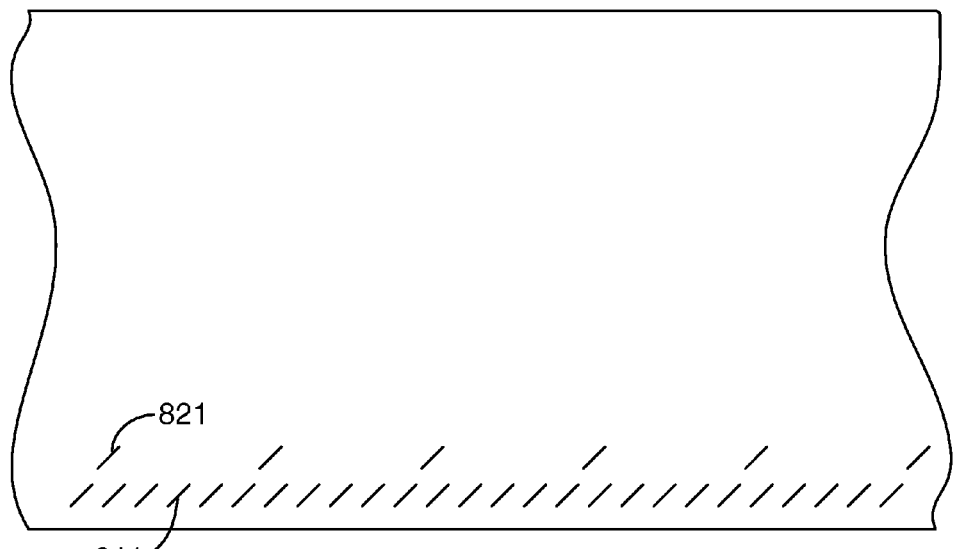

FIGS. 7 and 8 further illustrate fiducials that may be made using the processes described herein. Piecewise continuous fiducials such as those illustrated in FIGS. 7 and 8 are particularly useful for fiducial methods, such as ablation, that produce voids in the substrate where continuous marks would cut off a portion of the substrate. Each of these fiducial examples include substantially continuous portions that have slopes that are finite and non-zero relative to the longitudinal axis of the substrate. A piecewise continuous fiducial such as those illustrated in FIG. 7 or 8 may be made by controlling the operation of the fiducial device to interrupt making the fiducial during selected portions of the traverse across the substrate along the trajectory. The operation of each of the fiducial devices used to make the fiducials 711, 721 may be independently controlled to interrupt the making of the fiducial on the substrate creating the piecewise continuous patterns. FIG. 7 illustrates sine 711 and cosine 721 fiducials that are piecewise continuous.

FIG. 8 illustrates another configuration that can be made using coupled first and second fiducial devices that are moved together across the substrate. In this example, the first fiducial device is operative during a portion of every cycle across the substrate to make the first fiducial 811 having a first frequency, whereas the second fiducial device is only operative during every fifth cycle across the substrate, making the second fiducial 821 having a second frequency.

Figure 9:
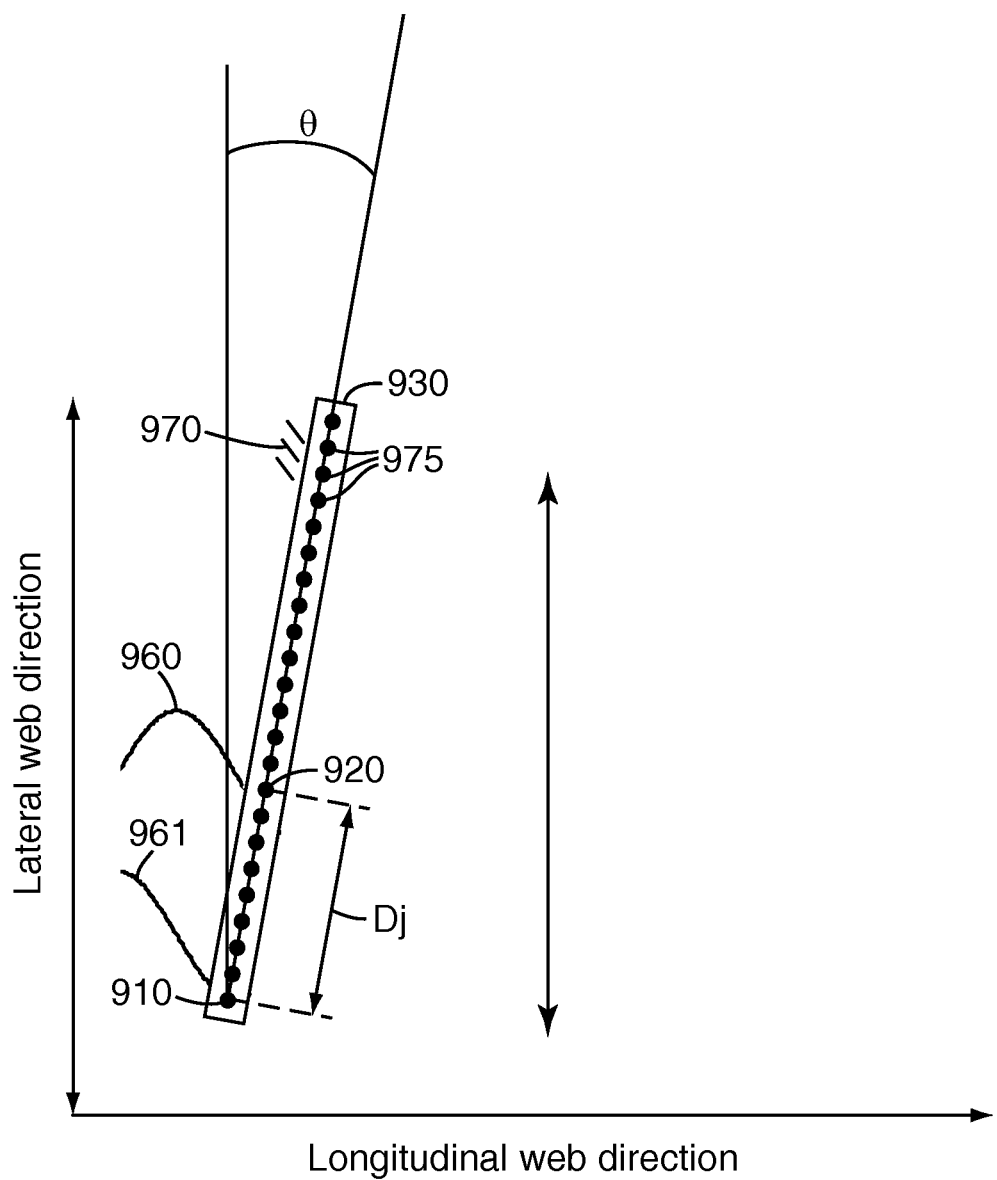
FIG. 9 illustrates operation of a single print head to make first and second substantially continuous fiducials and discrete fiducials in accordance with embodiments of the invention.

In some applications, it is advantageous to use both discrete fiducials and substantially continuous fiducials for determining substrate position. FIG. 9 illustrates a configuration that may be used to print both substantially continuous fiducials 960, 961 and discrete fiducials 970 in one pass along the substrate. The print head 930 illustrated in FIG. 9 is tilted at an angle, θ, with respect to the lateral substrate axis, similar to the configuration of FIG. 4. The ink jet apertures 910, 920 used to make the continuous fiducials 961, 960 are spaced apart on an ink jet print head 930 which serves as a coupling member to couple the ink jet apertures 910, 920. A first aperture 910 is used to make one fiducial 961 on the substrate and a second aperture 920 is used to make another fiducial 960 on the substrate.

Each of the first and the second apertures 910, 920 are controlled so that they eject drops to produce fiducials 961, 960 that are substantially continuous. One or more additional print apertures 975 are operated intermittently to print discrete fiducials 970 on the substrate. In this example, the discrete fiducials 970 are very brief sinusoidal segments placed intermittently along the substrate. The discrete fiducials may be used to aid in absolute position determinations, and/or to initiate the identification of zero crossings of the periodic fiducials. Additional information regarding the use of the various types of fiducials described herein to determine substrate position is discussed further in commonly owned U.S. Patent Application 60/884,494, filed Jan. 11, 2007, and 61/141,128, filed Dec. 29, 2008, which are incorporated herein by reference in their respective entireties.

EXAMPLE

Web—DUPONT/TEIJIN ST504,8" wide
Printhead—SPECTA/DIMATIX SE-128
Actuator/Servo—Permanent Magnet linear motor, 20 μm Renishaw linear encoder, KOLLMORGEN Servostar amplifier
Machine—Precision Web handling machine, web speed controlled via a position loop.
Silver ink—CABOT AG-IJ-G-100-S1, CCI-300
A SPECTRA/DIMATIX SE-128 Print head was attached to a linear servo-motor oriented perpendicular to the down web (longitudinal) direction of the machine. In between the print head and the servo motor were micromanipulation stages capable of Z axis and theta axis positioning.

First, a guideline was printed onto new web at 4 feet per minute with CABOT silver ink from a single orifice of the print head. Down web from the printing station is a drying station that dries the guideline to allow face side contact. Next the web was rewound back through the machine and the print head angle was set to 14.47 degrees and the cross web (lateral) position was incremented by 5 mm.

Using precision guiding techniques and the previously deposited guideline, the web was transported back through the machine while the print head was oscillated. The frequency of the oscillation was based on the down web position and the desired period of the sine waves. The period was set to give 50 cycles in an 8" length of web, or a period (Ps) of 4064 um. The previously stated angle was calculated using Dj=508 um*8, Ps=4064. Two orifices of the print head were chosen to provide a 90 degree phase offset and remain in a 7 mm field of view (Jet 1 and Jet 9). At a web speed of 4 fpm, the oscillation frequency works out to be 5 Hz.

Figure 10:
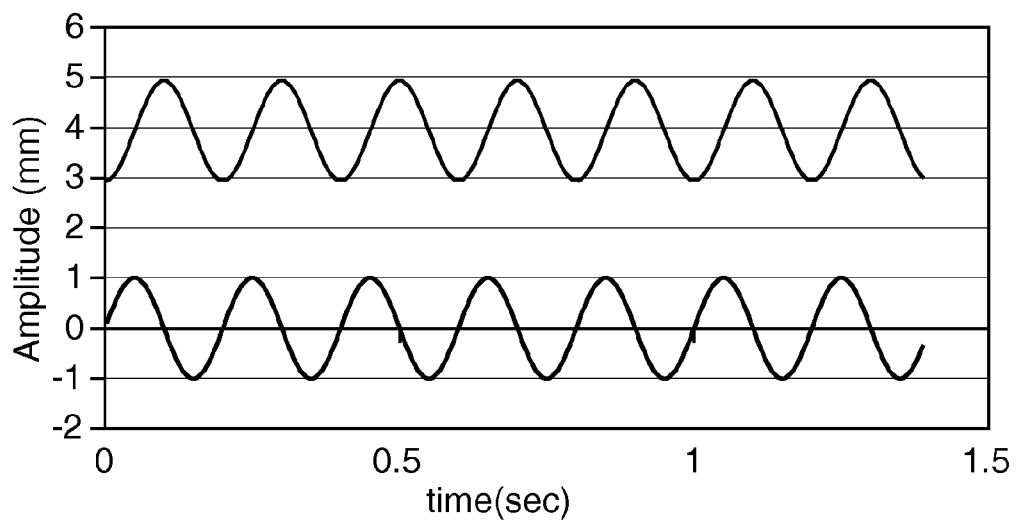
FIG. 10 is a graph showing sine and cosine fiducials that can be formed using approaches in accordance with embodiments of the invention.

FIG. 10 is a graph showing how the fiducials made by this process should look, in one second 0.8 inches of web is transported through the machine.

Figure 11:
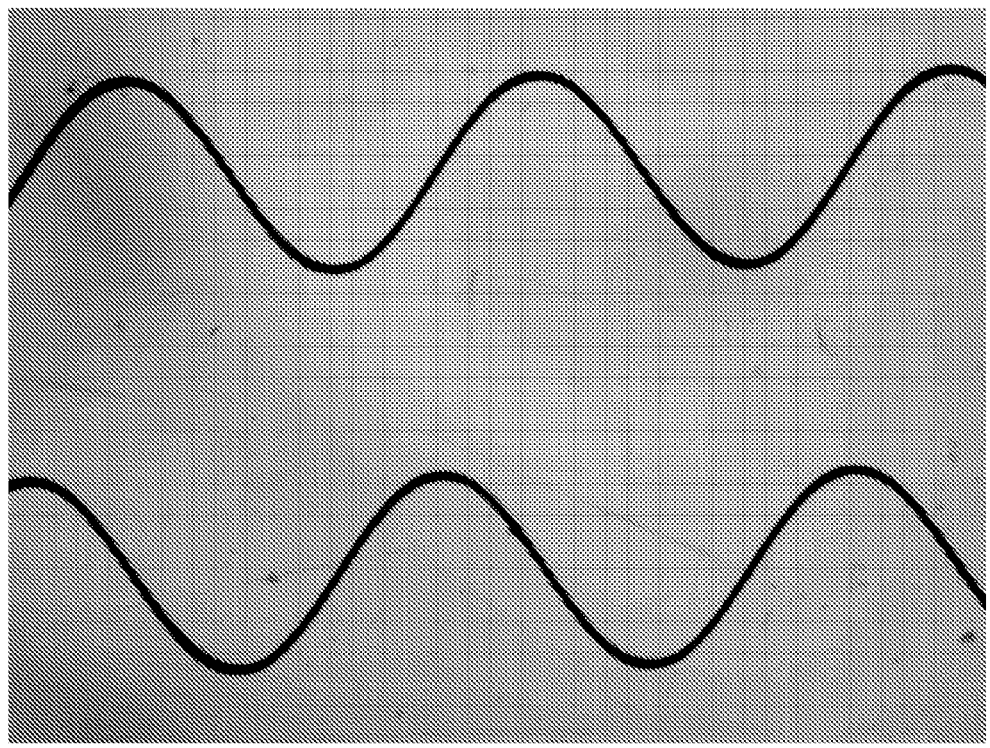
FIG. 11 is a photograph of the fiducials printed on a 5 mil polyethylene terephtalate (PET) substrate.

FIG. 11 is a photograph of the fiducials generated using this method on 5 mil PET substrate. The ink used for pattern generation is nanoparticle silver from CABOT.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus configured to make fiducials on a substrate having a longitudinal axis and a lateral axis, the apparatus comprising:
   a first fiducial device configured to make a first fiducial on the substrate, the first fiducial comprising at least a continuous portion having a slope that is finite and non-zero relative to the longitudinal axis;
   a second fiducial device mechanically coupled to the first fiducial device, the second fiducial device configured to make a second fiducial on the substrate, the second fiducial comprising at least a continuous portion having a slope that is finite and non-zero relative to the longitudinal axis;
   a longitudinal movement mechanism configured to provide a relative longitudinal motion between the substrate and the first and second fiducial devices along the longitudinal axis;
   a lateral movement actuator configured to provide a relative lateral motion that moves the first and second fiducial devices together back and forth across the substrate along a lateral trajectory having a lateral axis component during operation of the first and second fiducial devices to make the fiducials and during the relative longitudinal motion between the substrate and the first and second fiducial devices, and the first and second fiducial devices being oriented at a non-zero angle with respect to the lateral trajectory; and
   one or more control modules functionally connected to the longitudinal movement mechanism and the lateral movement actuator, the one or more control modules being configured to coordinate the relative longitudinal motion and the relative lateral motion such that the first fiducial device moves along a first relative trajectory with respect to the substrate and the second fiducial device moves along a second relative trajectory with respect to the substrate, the first and second relative trajectories respectively corresponding to the first and second fiducials and being phase-shifted with each other.

2. The apparatus of claim 1, wherein the first and the second fiducial devices operate at substantially constant energy per unit fiducial area to make the fiducials on the substrate.

3. The apparatus of claim 1, wherein:
   the first fiducial made by the first fiducial device comprises a first sinusoidal fiducial; and
   the second fiducial made by the second fiducial devices comprises a second sinusoidal fiducial.

4. The apparatus of claim 1, wherein one or more of the first fiducial device and the second fiducial device are configured to print on the substrate.

5. The apparatus of claim 1, wherein one or more of the first fiducial device and the second fiducial device are configured to ablate the substrate.

6. The apparatus of claim 1, wherein one or more of the first fiducial device and the second fiducial device are configured to scribe the substrate.

7. The apparatus of claim 1, wherein one or more of the first fiducial device and the second fiducial device comprises a photolithographic device.

8. The apparatus of claim 1, further comprising at least one additional fiducial device configured to make at least one additional fiducial on the substrate.

9. The apparatus of claim 8, wherein the additional fiducial device is not coupled to move together with the first and the second fiducial devices.

10. The apparatus of claim 1, wherein the longitudinal movement mechanism comprises a rotating drum.

11. An apparatus configured to print fiducials on a substrate having a longitudinal axis and lateral axis, the apparatus comprising:
   a first print aperture configured to eject ink to print a first fiducial having a substantially continuous portion along the longitudinal axis on the substrate;
   a second print aperture coupled to the first print aperture, the second print aperture configured to eject ink to print a second fiducial having a substantially continuous portion along the longitudinal axis on the substrate;
   a longitudinal movement mechanism configured to provide a relative longitudinal motion between the substrate and the first and second print apertures along the longitudinal axis of the substrate;
   a lateral movement actuator configured to provide a relative lateral motion that moves the first and the second print apertures back and forth together along a lateral trajectory having at least a lateral axis component during operation of the first and second print apertures to print the fiducials and during the relative longitudinal motion between the first and second print apertures and the substrate along the longitudinal axis, and the first and second print apertures being oriented at a non-zero angle with respect to the lateral trajectory; and
   one or more control modules functionally connected to the longitudinal movement mechanism and the lateral movement actuator, the one or more control modules being configured to coordinate the relative longitudinal motion and the relative lateral motion such that the first print aperture moves along a first relative trajectory with respect to the substrate and the second print aperture moves along a second relative trajectory with respect to the substrate, the first and second relative trajectories respectively corresponding to the first and second fiducials and being phase-shifted with each other.

12. The apparatus of claim 11, wherein the first and second print apertures are configured to eject ink at a substantially constant rate to print the fiducials on the substrate.

13. The apparatus of claim 11, wherein the first print aperture is arranged on a first print head and the second print aperture is arranged on a second print head coupled to the first print head.

14. The apparatus of claim 11, wherein the first print aperture and the second print aperture are arranged so that the first fiducial printed by the first print aperture is phase shifted from the second fiducial printed by the second print aperture.

15. The apparatus of claim 11, wherein first print aperture and the second print aperture are arranged in a column of a print head and the column is tilted at a non-zero angle with respect to the lateral axis.

16. The apparatus of claim 11, wherein the fiducials have a substantially constant spatial frequency with respect to the longitudinal axis.

17. The apparatus of claim 16, further comprising an additional fiducial device configured to operate during relative motion between the additional fiducial device and the substrate to make a substantially horizontal line on the substrate.

18. The apparatus of claim 11, further comprising an additional fiducial device configured to operate during relative motion between the additional fiducial device and the substrate make a series of discrete fiducial marks on the substrate.

19. The apparatus of claim 18, wherein the additional fiducial device is coupled to move together with the first and second fiducial devices.

20. The apparatus of claim 11, wherein:
the first fiducial printed by the first print aperture comprises a sine wave; and
the second fiducial printed by the second print aperture comprises a cosine wave.

21. A method of making fiducials on a substrate having a longitudinal axis and a lateral axis, the method comprising:
moving a first fiducial device and a second fiducial device together back and forth along a lateral trajectory having a component along the lateral axis, the first and second fiducial devices being oriented at a non-zero angle with respect to the lateral trajectory;
providing relative motion between the substrate and the first and second fiducial devices along the longitudinal axis while moving the first and second fiducial devices together back and forth along the lateral trajectory at the same time such that the first fiducial device moves along a first relative trajectory with respect to the substrate and the second fiducial device moves along a second relative trajectory with respect to the substrate, the first and second relative trajectories being phase-shifted with each other;
operating the first fiducial device when the first fiducial device moves along the first relative trajectory to make a first fiducial on the substrate; and
operating the second fiducial device when the second fiducial device moves along the second relative trajectory to make a second fiducial on the substrate.

22. The method of claim 21, wherein moving the first fiducial device and the second fiducial device together back and forth along the trajectory comprises moving the first fiducial device and the second fiducial device together back and forth at a substantially constant spatial frequency with respect to the longitudinal axis.

23. The method of claim 21, wherein:
operating the first fiducial device comprises operating the first fiducial device to make one sinusoidal fiducial on the substrate; and
operating the second fiducial device comprises operating the second fiducial device to make another sinusoidal fiducial on the substrate, wherein the first sinusoidal fiducial is phase shifted with respect to the second sinusoidal fiducial.

24. The method of claim 21, wherein operating the first fiducial device comprises printing on the substrate.

25. The method of claim 21, further comprising operating an additional fiducial device to make an additional fiducial on the substrate.

26. The method of claim 25, wherein operating the additional fiducial device comprises printing a substantially straight line along the longitudinal axis.

27. The method of claim 25, wherein operating the additional fiducial device comprises printing discrete fiducial marks on the substrate.

28. The method of claim 21, wherein:
the substrate is a flexible web; and
providing the relative motion between the first and the second fiducial devices and the substrate along the longitudinal axis comprises constraining the flexible web on a drum and rotating the drum.

* * * * *

UNITED STATES PATENT AND TRADEMARK OFFICE
CERTIFICATE OF CORRECTION

| | | |
|---|---|---|
| PATENT NO. | : 8,992,104 B2 | Page 1 of 1 |
| APPLICATION NO. | : 13/130610 | |
| DATED | : March 31, 2015 | |
| INVENTOR(S) | : Daniel Carlson et al. | |

It is certified that error appears in the above-identified patent and that said Letters Patent is hereby corrected as shown below:

In the Drawings

Figure 1,
Reference Numeral 170, delete "Longitidinal" and insert -- Longitudinal --, therefor.

Figure 6,
Reference Numeral 170, delete "Longitidinal" and insert -- Longitudinal --, therefor.

In the Specification

Column 3,
Line 2, delete "terephtalate" and insert -- terephthalate --, therefor.

Signed and Sealed this
Fifteenth Day of September, 2015

Michelle K. Lee
*Director of the United States Patent and Trademark Office*